(12) United States Patent
Sato

(10) Patent No.: US 8,075,689 B2
(45) Date of Patent: Dec. 13, 2011

(54) APPARATUS FOR THE PRODUCTION OF SILICA CRUCIBLE

(75) Inventor: Masaru Sato, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 154 days.

(21) Appl. No.: 12/550,036

(22) Filed: Aug. 28, 2009

(65) Prior Publication Data

US 2010/0055222 A1     Mar. 4, 2010

(30) Foreign Application Priority Data

Aug. 30, 2008 (JP) .................................. 2008-222955
Aug. 21, 2009 (JP) .................................. 2009-191860

(51) Int. Cl.
*C03B 19/09* (2006.01)

(52) U.S. Cl. ........................................ 117/200; 117/208

(58) Field of Classification Search .................. 117/200, 117/208
See application file for complete search history.

(56) References Cited

U.S. PATENT DOCUMENTS

| | | | | |
|---|---|---|---|---|
| 5,066,330 A * | 11/1991 | Holcombe et al. | ........ | 106/287.34 |
| 5,069,741 A * | 12/1991 | Kida et al. | ........ | 117/31 |
| 5,683,281 A * | 11/1997 | Metter | ........ | 442/179 |
| 5,800,924 A * | 9/1998 | Metter | ........ | 428/408 |
| 5,917,103 A * | 6/1999 | Watanabe et al. | ........ | 65/17.3 |
| 6,007,873 A * | 12/1999 | Holcombe et al. | ........ | 427/376.2 |
| 6,143,073 A * | 11/2000 | Christman et al. | ........ | 117/208 |
| 6,399,203 B1 * | 6/2002 | Kondo et al. | ........ | 428/408 |
| 6,444,271 B2 * | 9/2002 | Wittenauer et al. | ........ | 427/376.2 |
| 6,489,027 B1 * | 12/2002 | Kondo et al. | ........ | 428/408 |
| 6,524,668 B1 * | 2/2003 | Tsuji et al. | ........ | 428/34.6 |
| 6,589,661 B2 * | 7/2003 | Neely, Jr. | ........ | 428/457 |
| 6,808,744 B2 * | 10/2004 | Tsuji et al. | ........ | 427/183 |
| 7,105,047 B2 * | 9/2006 | Simmons et al. | ........ | 106/600 |
| 7,198,247 B2 * | 4/2007 | Kusano et al. | ........ | 249/184 |
| 7,419,924 B2 * | 9/2008 | Koike et al. | ........ | 501/54 |
| 7,820,278 B2 * | 10/2010 | Komiyama et al. | ........ | 428/219 |
| 2002/0029737 A1 * | 3/2002 | Sato et al. | ........ | 117/200 |
| 2002/0166340 A1 * | 11/2002 | Kemmochi et al. | ........ | 65/17.3 |
| 2006/0156958 A1 * | 7/2006 | Simmons et al. | ........ | 106/600 |
| 2007/0051297 A1 * | 3/2007 | Kemmochi et al. | ........ | 117/13 |
| 2007/0102133 A1 * | 5/2007 | Kemmochi et al. | ........ | 164/335 |
| 2010/0071417 A1 * | 3/2010 | Kishi et al. | ........ | 65/66 |

FOREIGN PATENT DOCUMENTS

| | | |
|---|---|---|
| JP | 56-149333 A | 11/1981 |
| JP | 1-148782 A | 6/1989 |
| JP | 8-002932 A | 1/1996 |
| JP | 11-199370 A | 7/1999 |
| JP | 2001220160 A | 8/2001 |
| JP | 2003-095678 A | 4/2003 |

OTHER PUBLICATIONS

Extended European Search Report mailed Nov. 18, 2009, in corresponding European Application No. 09168902.6.

* cited by examiner

*Primary Examiner* — Yogendra Gupta
*Assistant Examiner* — Emmanuel S Luk
(74) *Attorney, Agent, or Firm* — Christensen O'Connor Johnson Kindness PLLC

(57) ABSTRACT

In an apparatus for the production of a silica crucible comprising a carbon mold suitable for producing the silica crucible by the rotating mold method, the carbon mold has a thermal conductivity of not more than 125 W/(m·K).

6 Claims, 1 Drawing Sheet

APPARATUS FOR THE PRODUCTION OF SILICA CRUCIBLE

BACKGROUND OF THE INVENTION

1. Field of the Invention

This invention relates to an apparatus for producing a crucible of vitreous silica (silica glass) for use in the pulling of a silicon single crystal, and more particularly to an apparatus for producing a silica crucible suitable for forming a sintered layer of a semi-molten state on an outer wall portion of the crucible during the arc heating.

2. Description of the Related Art

In the pulling of a silicon single crystal is used a silica crucible placing a silicon melt therein. In the silica crucible, an inner wall portion (inner surface layer) is in contact with the silicon melt and is constituted with a silica glass layer substantially containing no air bubble, while an outer wall portion (outer surface layer) is constituted with a sintered layer containing many air bubbles for dispersing heat of external radiation to uniformly transfer to an inside of a mold.

As a method of producing the silica crucible is conventionally known a rotating mold method. This production method is a method wherein silica powder deposited onto an inner face of a rotating mold is vitrified by heating from a spacing side of the mold to produce a crucible. In this case, an inner wall portion made from a silica glass layer substantially containing no air bubble is formed by sucking air in the deposited layer of the silica powder from the side of the mold under a reduced pressure during the heat-melting to conduct vacuuming for removing air bubbles in the deposited layer (see JP-A-S56-149333 and JP-A-H01-148782, for example).

Recently, as the size of the crucible becomes bigger, the crucible temperature during the pulling tends to be higher. As the crucible temperature rises, the viscosity of the glass decreases and there is a fear of deforming the crucible in use. As a countermeasure, there is known a way that a glass crystallization accelerator is applied onto or included in the surface of the crucible to crystallize the glass forming the crucible under a high temperature to thereby enhance the strength of the crucible.

For example, JP-A-H08-2932 discloses that a crystallization accelerator (alkali metal, alkaline earth metal or the like) is applied onto a surface of an inner wall portion of the silica crucible or the crystallization accelerator is included in the inner wall portion so as to crystallize the inner wall portion of the crucible promptly using the crystallization accelerator as a nucleus. Also, JP-A-H11-199370 discloses a vitreous silica layer obtained by forming a layer containing a crystallization accelerator on a lower side of an inner wall portion made from a silica glass (side an outer wall portion) so as to prevent the crystallization accelerator from contacting with a silicon melt. Further, JP-A-2003-95678 discloses that a crystallization accelerator is attached on an outer wall portion as well as an inner wall portion of a crucible to enhance the dimensional stability of the inner wall portion of the crucible.

However, when the crystallization accelerator is applied on the surface of the inner wall portion of the crucible, there is a fear that the crystallization accelerator is incorporated into the silicon melt by contacting therewith to increase the impurity concentration in a silicon single crystal. On the other hand, when the crystallization accelerator is applied on the surface of the outer wall portion of the crucible, since the crystallization accelerator is at a state of contacting with a carbon container mounted with the crucible during the pulling, carbon is reacted with the crystallization accelerator under a higher temperature to generate a gas, which may deteriorate the quality of the silicon single crystal. Moreover, when the crystallization accelerator is included into the glass of the crucible, it is required to take means for incorporating the crystallization accelerator into silica or quartz powder in the production of the crucible, which makes the production of the crucible complicated.

SUMMARY OF THE INVENTION

In order to solve the above problem, it is an object of the invention to provide an apparatus for the production of a silica crucible wherein a sintered layer being at a semi-molten state in the production of a silica crucible (in arc heating) and crystallized at a higher temperature to increase the strength can be efficiently formed on an outer surface (outer wall portion) of a silica crucible by attaining the optimization of a carbon mold. Moreover, the term "sintered layer" used herein is a sintered layer when the silica crucible is constituted with two layers of an inner surface (inner wall portion) made from a silica glass layer and an outer surface (outer wall portion) made of a sintered layer at a state of sintering silica or quartz powder, and means a state that a crystal layer remains in an interior of a particle form existing in the sintered layer and a surface portion of the particle form is amorphous. Incidentally, an X-ray intensity as measured on the silica glass layer, the sintered layer and the silica or quartz powder layer left in the production of the crucible by an X-ray diffraction method is in the order of silica or quartz powder layer>sintered layer>silica glass layer.

In order to achieve the above object, the summary and construction of the invention are as follows:

(1) An apparatus for the production of a silica crucible comprising a carbon mold for producing the silica crucible by a rotating mold method, characterized in that the carbon mold has a thermal conductivity of not more than 125 W/(m·K).

(2) An apparatus for the production of a silica crucible according to the item (1), wherein the carbon mold has a thermal conductivity of not less than 70 W/(m·K).

(3) An apparatus for the production of a silica crucible according to the item (1) or (2), wherein the carbon mold has a bulk specific gravity of not more than 1.6 g/cm$^3$.

(4) An apparatus for the production of a silica crucible according to the item (3), wherein the carbon mold has a bulk specific gravity of not less than 1.3 g/cm$^3$.

In the apparatus for the production of a silica crucible according to the invention, the sintered layer being at a semi-molten state in the production of the silica crucible (in arc heating) and crystallized at a higher temperature to increase the strength can be efficiently formed on the outer surface (outer wall portion) of the silica crucible by attaining the optimization of the carbon mold.

Particularly, the carbon mold constituting the production apparatus according to the invention is lower in the thermal conductivity as compared with the conventional carbon mold, so that it is possible to easily form the sintered layer having a given thickness on the outer surface of the crucible even if the amount of silica or quartz powder used is reduced as compared with the conventional production apparatus.

The silica crucible having the sintered layer has advantages that since the sintered layer is easily crystallized at a higher temperature, the strength of the crucible is high and the crucible is hardly deformed. Therefore, it is possible to obtain a silicon single crystal ingot having a high single crystallization rate when a silicon single crystal is pulled using the silica crucible produced with the production apparatus according to the invention.

BRIEF DESCRIPTION OF THE DRAWINGS

The invention will be described with reference to the accompanying drawings, wherein.

DESCRIPTION OF THE PREFERRED EMBODIMENTS

An embodiment of the invention will be described concretely below.

The apparatus for producing a silica crucible according to the invention is an apparatus comprising a carbon mold for producing the silica crucible by a rotating mold method. The carbon mold is preferable to have a thermal conductivity of not more than 125 W/(m·K) but not less than 70 W/(m·K). Moreover, in order to render the thermal conductivity of the carbon mold into the above range, a bulk specific gravity of the carbon mold is preferable to be not more than 1.6 g/cm$^3$ and more preferable to be not less than 1.3 g/cm$^3$.

The rotating mold method is a method wherein silica or quartz powder is deposited on an inner surface of a rotating mold and vitrified by melting under heating from a spacing side of the mold through arc discharge or the like to produce a fused silica crucible. As the mold is usually used a carbon mold. In this case, silica or quartz powder is deposited with a given thickness on the inner surface of the mold and then melted under heating.

The silica or quartz powder deposited on the inner surface of the mold is vitrified by melting from the surface side of the silica or quartz powder deposition layer through arc heating to gradually promote molten vitrification toward the inner surface of the mold. On the other hand, the inner surface of the mold is controlled to a temperature slightly lower than the vitrification temperature, so that a portion of the silica or quartz powder deposition layer close to the mold inner surface is at a semi-molten state, and further a thin unmelted portion of the silica or quartz powder remains in a portion contacting with the mold inner surface as it is. The silica crucible cooled after the molten vitrification step is taken out from the mold and then the unmelted portion is removed from the outer surface of the crucible by mechanical grinding or the like, whereby there is obtained a fused silica crucible having a two-layer structure that the inner surface of the crucible is made of a fused silica layer and a semi-molten layer is existent in the outer surface side of the crucible.

Figure 1:
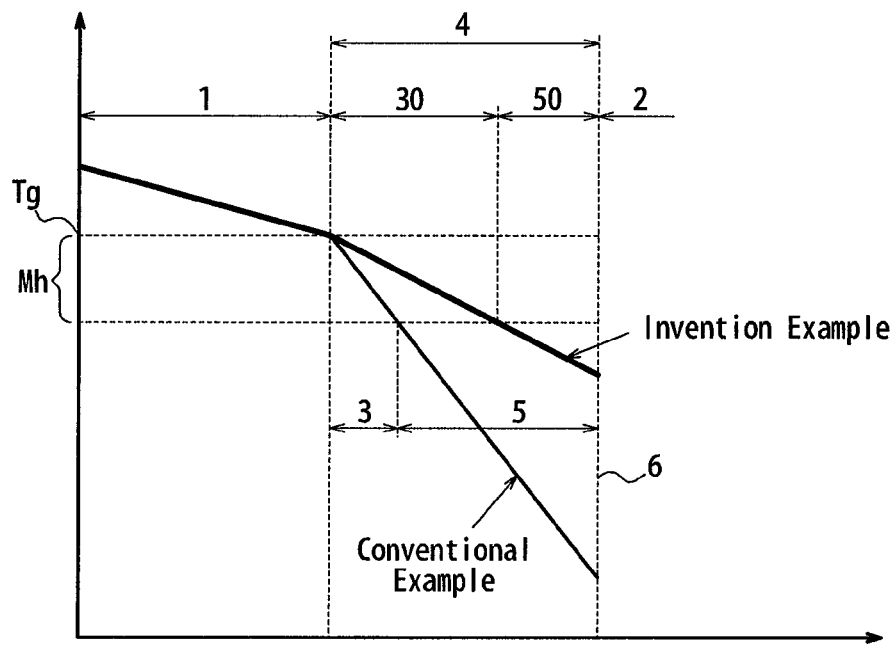
FIG. 1 is a graph conceptually showing a thickness ratio of a silica glass layer, a sintered layer and an unmelted silica or quartz powder layer between Invention Example and Conventional Example when the silica or quartz powder layer deposited in a rotating mold constituting an apparatus for the production of a silica crucible is heated from a spacing side of the mold.

In FIG. 1 is shown a melting state of silica or quartz powder in the above molten vitrification step. As shown in the figure, a molten-vitrified silica layer 1 is formed at the inner wall portion side of the crucible, while a sintered layer 3 of a semi-molten state is formed at a side of a mold 2. In case of using a mold having a high cooling efficiency, a temperature of an inner surface 6 of the mold is low, so that a heat gradient from an inner surface side of the silica or quartz powder (deposited) layer (a side to be molten-vetrified) toward an outer surface side thereof contacting with the mold 2 during the melting becomes large (Conventional Example in FIG. 1). When the heat radient is large, a thickness ratio of a portion of a silica or quartz powder layer of a semi-molten state located within a semi-melting temperature range Mh (concretely a sintered layer 3) occupied in a portion 4 of the silica or quartz powder layer falling below the vitrification temperature (melting temperature) Tg is small, and hence a ratio of the silica or quartz powder layer 5 of the unmelted state left as silica or quartz powder becomes large.

On the other hand, when using a mold having a good heat insulating property that a thermal conductivity is as low as not more than 125 W/(m·k) as defined in the invention, the temperature of the mold inner surface 6 becomes relatively high as shown by a thick solid line in FIG. 1, so that the heat gradient from the inner wall side of the silica or quartz powder layer toward the outer wall side thereof contacting with the mold 2 during the melting becomes small (Invention Example in FIG. 1). Therefore, the thickness ratio of a portion of a silica or quartz powder layer of a semi-molten state located within a semi-melting temperature range Mh (concretely a sintered layer 30) occupied in the portion 4 of the silica or quartz powder layer falling below the vitrification temperature (melting temperature) Tg is large, and hence a ratio of a silica or quartz powder layer 50 of an unmelted state left as silica or quartz powder becomes small, and as a result, the thick sintered layer 30 is formed. Thus, in order to thickly form the sintered layer 30 constituting the silica crucible, it is necessary to make the heat gradient from the inner wall side toward the outer wall side in the silica or quartz powder layer during the melting as small as possible.

Figure 2:
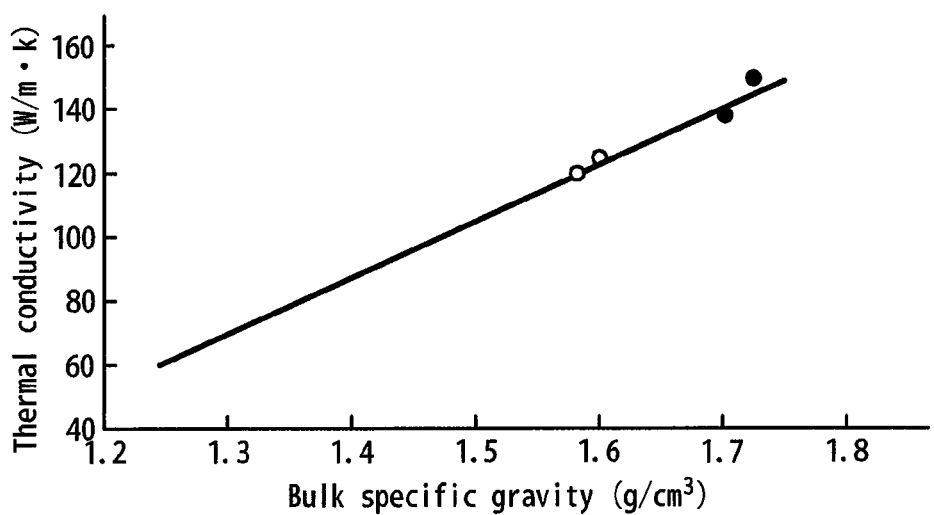
FIG. 2 is a graph showing an example of a relationship between bulk specific gravity and thermal conductivity in a carbon mold.

FIG. 2 shows an example of a relationship between bulk specific gravity and thermal conductivity of a carbon mold. The conventional carbon mold used in the production apparatus for a silica crucible has a bulk specific gravity of 1.7 to 1.8 g/cm$^3$ and a thermal conductivity of about 140 to 160 W/(m·K) as shown by black circles in FIG. 2, which is larger in the bulk specific gravity and higher in the thermal conductivity as compared with those of the carbon mold used for the production apparatus according to the invention. As seen from the results of FIG. 2, the thermal conductivity and the bulk specific gravity of the carbon mold are in a linear proportional relation.

Therefore, since the conventional carbon mold is higher in the thermal conductivity and lower in the heat insulating property as compared with the carbon mold of the invention, the silica or quartz powder deposited on the mold inner surface (silica or quartz powder deposition layer) should be formed thick for making the heat gradient small. For example, in order to form a sintered layer having a thickness of about 0.5 mm with respect to a crucible having a diameter of 32 inches (812.8 mm), it is necessary to deposit a silica or quartz powder layer inside a mold at a thickness corresponding to three to four times the thickness of the final crucible composed of a silica glass layer and a sintered layer, which has a problem that the amount of the silica or quartz powder used becomes large.

On the other hand, the thermal conductivity of the carbon mold used in the production apparatus according to the invention is not more than 125 W/(m·k), preferably not less than 70 W/(m·k) as shown by white circles in FIG. 2, which is lower than the thermal conductivity of the conventional carbon mold. Moreover, in order to render the thermal conductivity of the carbon mold into not more than 125 W/(m·K), the bulk specific gravity of the mold is preferable to be not more than 1.6 g/cm$^3$ and more preferable to be 1.3 to 1.6 g/cm$^3$, which is smaller than the bulk specific gravity of the conventional carbon mold. Therefore, the heat gradient from the inner wall side of the silica or quartz powder layer toward the outer wall side thereof during the melting is small and hence a thick semi-molten layer may be formed without making the silica or quartz powder layer thick as in the conventional method.

Moreover, the term "bulk specific gravity" used herein indicates a value measured according to "7. Test methods for bulk specific gravity" in "Test methods for physical properties of graphite materials", which is defined in JIS R 7222-1997. Further, as a concrete means for adjusting the bulk specific gravity is mentioned, for example, a way wherein the particle size of coke powder used for sintering conducted in the production of a mold is appropriately selected according to the bulk specific gravity. In the mold according to the invention, there may be used coke powder having a particle size larger than that for the conventional mold.

When the thermal conductivity of the carbon mold exceeds 125 W(m·K), the difference in the thermal conductivity to the conventional carbon mold is too small and hence the amount of silica or quartz powder used becomes larger for thickly forming the sintered layer on the outer surface of the crucible likewise the case of using the conventional carbon mold. While, when the thermal conductivity of carbon mold is less than 70 W/(m·K), the heat gradient becomes small sufficiently, but the consumption of carbon constituting the mold is remarkably increased and the service life of the crucible is significantly short.

In the production apparatus according to the invention, in order to form a sintered layer having a thickness of about 0.5 mm for a crucible having a diameter of 32 inches (812.8 mm), the silica or quartz powder layer may be deposited inside the mold at a thickness corresponding to about 2.4 to 2.8 times the thickness of the final crucible. Thus, the amount of silica or quartz powder used can be controlled to about a half as compared with the case using the conventional producing apparatus.

Next, examples of the invention will be described together with a comparative example.

A silica crucible is produced by the rotating mold method with a production apparatus comprising a carbon mold with a bulk specific gravity shown in Table 1. As a heating means is used arc heating, and a pressure inside a silica or quartz powder layer deposited in the mold is reduced during the melting under heating to suck out internal air, whereby a silica glass layer is formed in an inner wall portion of a crucible and a sintered layer is formed in an outer wall portion of the crucible. The crucible has a diameter of 32 inches (812.8 mm) and an average thickness of 15 mm and the sintered layer located at the outer wall portion side is 0.5 mm. The results are shown in Table 1.

As shown in Table 1, in Conventional Example (No. 5) using the conventional carbon mold having a bulk specific gravity of 1.7 g/cm$^3$, the amount of silica or quartz powder used for the formation of a sintered layer having a thickness of 0.5 mm is large. On the other hand, in Examples 1 to 4 of the invention with a carbon mold having a bulk specific gravity of 1.2 to 1.6 g/cm$^3$, the amount of silica or quartz powder used for the formation of a sintered layer having a thickness of 0.5 mm is small. Moreover, in Comparative Example (No. 6) using a carbon mold with a bulk specific gravity of 1.1 g/cm$^3$, the amount of silica or quartz powder used is small, but the consumption of the mold is violent and the service life is short and is inferior in the economic aspect.

In the apparatus for the production of a silica crucible according to the invention, the sintered layer being at a semi-molten state in the production of the silica crucible (in arc heating) and crystallized at a higher temperature to increase the strength can be efficiently formed on the outer surface (outer wall portion) of the silica crucible by attaining the optimization of the carbon mold.

Particularly, the carbon mold constituting the production apparatus according to the invention is lower in the thermal conductivity as compared with the conventional carbon mold, so that it is possible to easily form the sintered layer having a given thickness on the outer surface of the crucible even if the amount of silica or quartz powder used is reduced as compared with the conventional production apparatus.

The silica crucible having the sintered layer has advantages that since the sintered layer is easily crystallized at a higher temperature, the strength of the crucible is high and the crucible is hardly deformed. Therefore, it is possible to obtain a silicon single crystal ingot having a high single crystallization rate when a silicon single crystal is pulled using the silica crucible produced with the production apparatus according to the invention.

What is claimed is:

1. An apparatus for the production of a silica crucible comprising:
    a carbon mold for processing silica or quartz powder to form a silica or quartz powder deposition layer and for producing the silica crucible by a rotating mold method, characterized in that the carbon mold has a thermal conductivity of not more than 125 W/(m·K), and the carbon mold is configured to reduce pressure inside the silica or quartz powder deposition layer from the side of the mold; and

TABLE 1

|  | No. 1 | No. 2 | No. 3 | No. 4 | No. 5 | No. 6 |
| --- | --- | --- | --- | --- | --- | --- |
| Bulk specific gravity of mold (g/cm$^3$) | 1.2 | 1.3 | 1.5 | 1.6 | 1.7 | 1.1 |
| Ratio of thickness of silica or quartz powder deposition layer to thickness of crucible | 2.60 | 2.65 | 2.75 | 2.80 | 3.00 | 2.50 |
| Amount of silica or quartz powder used | Small | Small | Small | Small | Large | Small |
| Thickness of sintered layer (mm) | 0.5 | 0.5 | 0.5 | 0.5 | 0.5 | 0.5 |
| Degree of mold consumption | Slightly large | Small | Small | Small | Small | Significant |
|  | Example 1 | Example 2 | Example 3 | Example 4 | Conventional Example | Comparative Example | an arc heater configured to heat the silica or quartz powder deposition layer from a spacing side of the carbon mold.

2. An apparatus for the production of a silica crucible according to claim 1, wherein the carbon mold has a thermal conductivity of not less than 70 W/(m·K).

3. An apparatus for the production of a silica crucible according to claim 1 wherein the carbon mold has a bulk specific gravity of not more than 1.6 g/cm$^3$.

4. An apparatus for the production of a silica crucible according to claim 3, wherein the carbon mold has a bulk specific gravity of not less than 1.3 g/cm$^3$.

5. An apparatus for the production of a silica crucible according to claim 2, wherein the carbon mold has a bulk specific gravity of not more than 1.6 g/cm$^3$.

6. An apparatus for the production of a silica crucible according to claim 5, wherein the carbon mold has a bulk specific gravity of not less than 1.3 g/cm$^3$.

* * * * *